United States Patent
Sorsby

(10) Patent No.: US 10,992,287 B1
(45) Date of Patent: *Apr. 27, 2021

(54) ADAPTIVE HARMONIC CANCELLATION

(71) Applicant: Rockwell Collins, Inc., Cedar Rapids, IA (US)

(72) Inventor: William Bascom Sorsby, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/704,295

(22) Filed: Dec. 5, 2019

Related U.S. Application Data

(63) Continuation of application No. 16/109,526, filed on Aug. 22, 2018, now Pat. No. 10,523,182.

(51) Int. Cl.
*H03H 21/00* (2006.01)
*H04B 15/00* (2006.01)
*H04B 1/04* (2006.01)
*H04B 1/10* (2006.01)

(52) U.S. Cl.
CPC ....... *H03H 21/0012* (2013.01); *H04B 1/0475* (2013.01); *H04B 1/109* (2013.01); *H04B 15/00* (2013.01)

(58) Field of Classification Search
CPC .. H03H 21/0012; H04B 1/0475; H04B 1/109; H04B 15/00
USPC ........ 455/295–296, 285, 302, 304, 310, 317
See application file for complete search history.

(56) References Cited

U.S. PATENT DOCUMENTS

| | | | |
|---|---|---|---|
| 9,455,757 | B2 | 9/2016 | Tripurari et al. |
| 10,523,182 | B1 * | 12/2019 | Sorsby ................ H04B 1/0475 |
| 2008/0194222 | A1 | 8/2008 | Liu et al. |

(Continued)

OTHER PUBLICATIONS

Final Office Action for U.S. Appl. No. 16/109,526 dated May 17, 2019, 15 pages.

(Continued)

*Primary Examiner* — Lee Nguyen
(74) *Attorney, Agent, or Firm* — Suiter Swantz pc llo

(57) ABSTRACT

Disclosed systems and methods relate to an adaptive harmonic cancellation circuit for communication. The adaptive harmonic cancellation circuit includes a harmonic generator circuit configured to generate a reference harmonic of an interference signal. The adaptive harmonic cancellation circuit includes a harmonic prediction circuit coupled to the harmonic generator circuit. The harmonic prediction circuit is configured to receive an input signal including a target signal at a frequency and a radiated harmonic of the interference signal. The harmonic prediction circuit is configured to generate a predicted harmonic of the interference signal by modifying the reference harmonic of the interference signal to match the radiated harmonic of the interference signal in the input signal. The adaptive harmonic cancellation circuit includes a cancellation circuit coupled to the harmonic prediction circuit. The cancellation circuit is configured to obtain the target signal at the frequency by subtracting the predicted harmonic from the input signal.

20 Claims, 9 Drawing Sheets

(56) References Cited

U.S. PATENT DOCUMENTS

2009/0291660 A1 11/2009 Trachewsky
2018/0048339 A1 2/2018 Wu et al.

OTHER PUBLICATIONS

Non-Final Office Action for U.S. Appl. No. 16/109,526 dated Jan. 24, 2019, 13 pages.
Notice of Allowance for U.S. Appl. No. 16/109,526 dated Aug. 28, 2019, 5 pages.

* cited by examiner

US 10,992,287 B1

ADAPTIVE HARMONIC CANCELLATION

CROSS-REFERENCE TO RELATED APPLICATION

The present application is a continuation under 35. U.S.C. § 120 of U.S. patent application Ser. No. 16/109,526 filed on Aug. 22, 2018, the content of which is hereby incorporated by reference in its entirety.

BACKGROUND

Embodiments of inventive concepts disclosed herein generally relate to communication systems and methods of cancelling harmonics of an interference signal.

Communication technology enables two or more communication systems to exchange data. In one approach, a transmitter of a first communication system generates a target signal and transmits the target signal to a receiver of a second communication system. The transmitter may transmit the target signal through a wireless medium or through a wired link. The transmitter may up-convert a baseband signal including content targeted for the second communication system to generate the target signal. Examples of content include audio, image, video, data, or any combination of them. The receiver may receive the target signal, and down-convert the target signal to obtain the content.

Communication between two communication systems may be degraded by harmonics of an interference signal. An interference signal may be a signal generated by one of the two communication systems or any device that is not part of the communication between the two communication systems. In one example, one or more harmonics of the interference signal may be at a frequency of the target signal or near the frequency of the target signal. Such harmonics of the interference signal may prevent the receiver from receiving the target signal and obtaining the content in the target signal.

SUMMARY

In one aspect, embodiments of the inventive concepts disclosed herein are directed to an adaptive harmonic cancellation circuit. The adaptive harmonic cancellation circuit includes a harmonic generator circuit configured to generate a reference harmonic of an interference signal. The adaptive harmonic cancellation circuit includes a harmonic prediction circuit coupled to the harmonic generator circuit. The harmonic prediction circuit is configured to receive an input signal at a frequency. The input signal includes a target signal and a radiated harmonic of the interference signal. The harmonic prediction circuit is configured to generate a predicted harmonic of the interference signal by modifying the reference harmonic of the interference signal to match the radiated harmonic of the interference signal in the input signal. The adaptive harmonic cancellation circuit includes a cancellation circuit coupled to the harmonic prediction circuit. The cancellation circuit is configured to obtain the target signal at the frequency by subtracting the predicted harmonic from the input signal.

In a further aspect, embodiments of the inventive concepts disclosed herein are directed to a method of adaptively cancelling a harmonic of interference. The method includes generating a reference harmonic of an interference signal. The method includes receiving an input signal at a frequency. The input signal includes a target signal and a radiated harmonic of the interference signal. The method includes generating a predicted harmonic of the interference signal by modifying the reference harmonic of the interference signal to match the radiated harmonic of the interference signal in the input signal. The method includes obtaining the target signal at the frequency by subtracting the predicted harmonic from the input signal.

In a further aspect, embodiments of the inventive concepts disclosed herein are directed to a system of adaptively cancelling a radiated harmonic of interference. The system includes an antenna configured to obtain a radio frequency signal in an analog representation. The radio frequency signal includes a target signal at a radio frequency and a harmonic of an interference signal. The system includes an analog to digital converter coupled to the antenna. The analog to digital converter is configured to convert the radio frequency signal to a converted signal in a digital representation. The system includes a harmonic generator circuit configured to generate a reference harmonic of the interference signal. The system includes a harmonic prediction circuit coupled to the analog to digital converter and the harmonic generator circuit. The harmonic prediction circuit is configured to generate a predicted harmonic of the interference signal by modifying the reference harmonic of the interference signal to match the radiated harmonic of the interference signal in the converted signal. The system includes a cancellation circuit coupled to the harmonic prediction circuit. The cancellation circuit is configured to obtain the target signal at the radio frequency by subtracting the predicted harmonic from the converted signal.

BRIEF DESCRIPTION OF THE FIGURES

Implementations of the inventive concepts disclosed herein may be better understood when consideration is given to the following detailed description thereof. Such description makes reference to the included drawings, which are not necessarily to scale, and in which some features may be exaggerated and some features may be omitted or maybe represented schematically in the interest of clarity. Like reference numerals in the drawings may represent and refer to the same or similar element, feature, or function. In the drawings.

DETAILED DESCRIPTION

Figure 1:
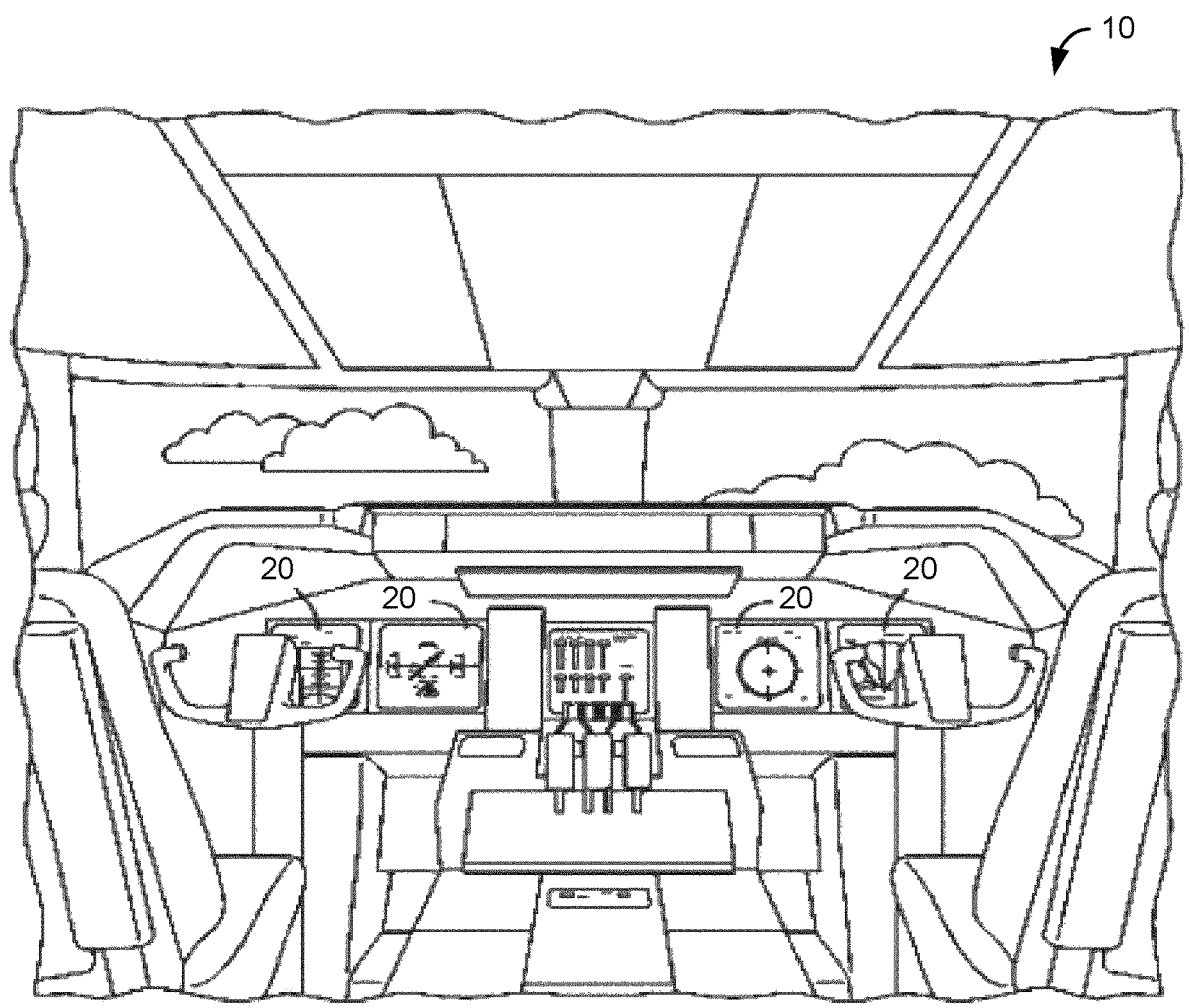
FIG. 1 is a perspective view schematic representation of an aircraft control center for an aircraft including a communication system with an adaptive harmonic cancellation, according to some embodiments.

Before describing in detail embodiments of the inventive concepts disclosed herein, it should be observed that the inventive concepts disclosed herein include, but are not limited to a novel structural combination of components and circuits disclosed herein, and not to the particular detailed configurations thereof. Accordingly, the structure, methods, functions, control and arrangement of components and circuits have, for the most part, been illustrated in the drawings by readily understandable representations and schematic diagrams, in order not to obscure the disclosure with structural details which will be readily apparent to those skilled in the art, having the benefit of the description herein. Further, the inventive concepts disclosed herein are not limited to the particular embodiments depicted in the diagrams provided in this disclosure, but should be construed in accordance with the language in the claims.

Disclosed systems and methods relate to an adaptive harmonic cancellation circuit for communication between at least two communication systems. The adaptive harmonic cancellation circuit may be implemented by a receiver of a communication system. The adaptive harmonic cancellation circuit receives an input signal including a target signal and one or more radiated harmonics of an interference signal. A target signal is a signal transmitted by a transmitter of a different communication system targeted for the receiver of the communication system. The transmitter may up-convert a baseband signal including content to generate the target signal. Examples of content include audio, image, video, data, or any combination of them. An interference signal is a signal not intended for the communication between the transmitter and the receiver. One or more harmonics of the interference signal may radiate, for example, through air space, and received by the receiver of the communication system with the target signal. The adaptive harmonic cancellation circuit adaptively generates a predicted harmonic of the interference signal, and removes the predicted harmonic of the interference from the input signal. Hence, the receiver may obtain the target signal with reduced harmonic of the interference signal.

In one aspect, the adaptive harmonic cancellation circuit generates a reference signal including one or more reference harmonics of the interference signal, and generates the predicted harmonic of the interference signal based on the reference signal. The adaptive harmonic cancellation circuit is capable of efficiently removing multiple harmonics of an interference signal having a time varying frequency. A reference harmonic of the interference signal is a harmonic generated based on the interference signal that is received from a source of the interference signal. The reference harmonic of the interference signal may be internally generated within the adaptive harmonic cancellation circuit, whereas the radiated harmonic of the interference signal may be radiated through the air space and received through an antenna together with the target signal. In one approach, the adaptive harmonic cancellation circuit down-converts the input signal at a radio frequency and down-converts the reference signal, and modifies the down-converted reference signal to match a phase, a delay, or amplitude of the down-converted input signal. The adaptive harmonic cancellation circuit may up-convert the modified down-converted reference signal to obtain the predicted harmonic at the radio frequency, and subtract the predicted harmonic from the input signal to obtain the target signal at the radio frequency.

Advantageously, the adaptive harmonic cancellation circuit allows a target signal to be extracted from the input signal in a real-time application. In one approach, radiated harmonics of an interference signal may be tracked by a feedback loop or a phase locked loop, and the tracked harmonics may be removed. However, a feedback loop or a phase locked loop may consume a long time for stabilization, and may fail to cancel harmonics of the interference signal in a real-time communication. The adaptive harmonic cancellation circuit predicts harmonics of an interference signal and removes the predicted interference signal from the input signal without implementing a feedback loop or a phase locked loop. By obviating a stabilization time due to the feedback loop or the phase locked loop, the adaptive harmonic cancellation circuit allows the predicted harmonics to be removed from the input signal in a prompt manner. Hence, time varying signals with reduced harmonics of an interference signal may be provided in real-time.

In addition, the adaptive harmonic cancellation circuit allows savings of hardware resources. Implementing a feedback loop or a phase locked loop may be inefficient in terms of hardware resources (e.g., cost and area). For generating predicted harmonics of an interference signal, the adaptive harmonic cancellation circuit disclosed herein may implement down-converters, up-converters, and equalizers having a smaller form factor than the feedback loop or the phase locked loop. Thus, the adaptive harmonic cancellation circuit enables hardware resources to be conserved compared to implementing a feedback loop or a phase locked loop that is inefficient in terms of hardware resources.

In one aspect, the adaptive harmonic cancellation circuit reduces multiple radiated harmonics of the interference signal from the input signal. In one implementation, the adaptive harmonic cancellation circuit includes multiple harmonic prediction circuits each configured to generate a corresponding predicted harmonic of the interference signal. Hence, the adaptive harmonic cancellation circuit may generate different predicted harmonics of the interference signal in parallel, and generate the target signal by subtracting the predicted harmonics of the interference signal from the input signal. In another implementation, the adaptive harmonic cancellation circuit includes a single harmonic prediction circuit that generates different predicted harmonics of the interference signal at corresponding subsets of a time period. Hence, the same portion of hardware of the adaptive harmonic cancellation circuit can be reused to generate different predicted harmonics of the interference signal, thereby allowing the area and cost of hardware resources to be reduced.

Referring to FIG. 1, an illustration of a cockpit or an aircraft control center 10 is shown, according to some embodiments. The aircraft control center 10 includes at least one flight display 20. A pilot may use the flight display 20 to increase visual range and to enhance decision-making abilities. In an exemplary embodiment, the flight display 20 may be configured to show weather, terrain, fixed obstacles, variable obstacles (e.g., other aircraft), flight characteristics (e.g., altitude or speed), targets, communication information, weapons and electronic countermeasure information, or any combination thereof. The flight display 20 can provide information received from a ground station, a satellite, another aircraft, or any device through a wireless communication.

Figure 2:
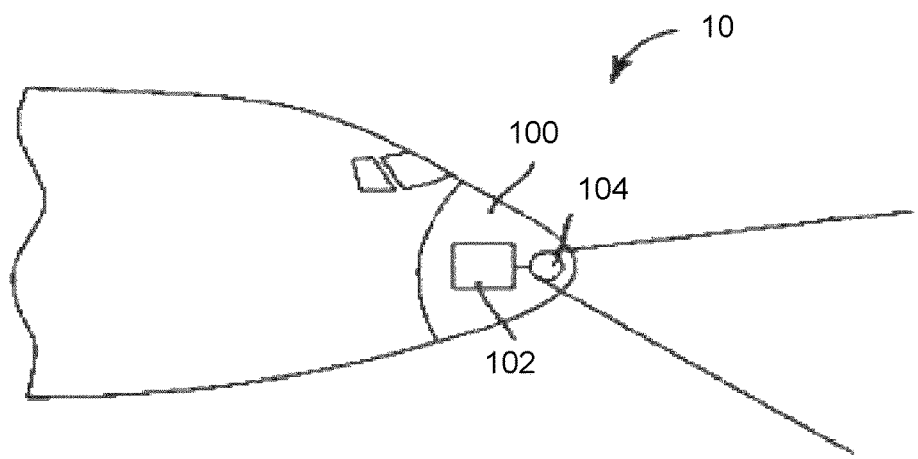
FIG. 2 is a side view schematic representation of the aircraft including the communication system with the adaptive harmonic cancellation illustrated in FIG. 1, according to some embodiments.

In FIG. 2, the front of an aircraft is shown with the aircraft control center 10 and a nose 100, according to some embodiments. A communication system 102 is generally located inside the nose 100 of the aircraft. In some embodiments, the communication system 102 is located at a top of the aircraft, on a tail of the aircraft, or on any part of the aircraft. While FIGS. 1 and 2 discuss the communication system 102 of the aircraft, the systems and methods discussed herein can be employed in any wireless communication application and can be employed on any stationary or mobile platform.

In some embodiments, the communication system 102 includes or is coupled to an antenna 104. The antenna 104 can be implemented as printed circuit board antenna elements, metallic channels or surfaces, or other conductive elements. In one aspect, the antenna 104 receives a wireless signal transmitted by an antenna of another system such as another aircraft, a ground station, a satellite, or any communication device. The wireless signal may be an electromagnetic wave traveling through air medium at a radio frequency. The radio frequency may be any frequency from a very low frequency (VLF) band (e.g., 3-30 kHz), low frequency (LF) band (e.g., 30-300 kHz), medium frequency (MF) band (e.g., 300 kHz-3 MHz), high frequency (HF) band (e.g., 3-30 MHz), very high frequency (VHF) band (e.g., 30-300 MHz), ultra high frequency (UHF) band (e.g., 300 MHz-3 GHz), super high frequency (SHF) band (e.g., 3-30 GHz), extremely high frequency (EHF) band (e.g., 30-300 GHz), and tremendously high frequency (THF) band (300 GHz-3 THz). The antenna 104 converts the wireless signal into an electrical signal with a corresponding voltage, current, or both. The electrical signal may contain a target signal transmitted from the transmitter of the other system. A target signal is a signal transmitted by a transmitter of a different communication system targeted for the communication system 102. The transmitter of the different communication system may up-convert a baseband signal including content to generate the target signal. Examples of content include audio, image, video, data, or any combination of them. The communication system 102 receives the electrical signal from the antenna 104, and extracts the target signal from the electrical signal. The communication system 102 may down-convert the target signal to obtain the baseband signal, and present content in the baseband signal to the pilot, for example, through the flight display 20 of FIG. 1.

In one aspect, the electrical signal includes radiated harmonics of an interference signal that degrade communication quality. An interference signal may be generated within the aircraft or by different communication systems. For example, the aircraft includes a motor or a generator that mechanically generates an interference signal at a low frequency (e.g., 400 Hz). Harmonics of the interference signal may radiate through air space and may be received by the antenna 104. Multiple radiated harmonics of the interference signal may be near or at a frequency of the target signal, and may hinder the receiver of the communication system 102 to obtain the target signal. For example, the frequency band of 10-60 kHz of the target signal encompasses $40^{th}$ to $150^{th}$ harmonics of a 400 Hz interference signal.

In various embodiments disclosed herein, the communication system 102 adaptively predicts one or more harmonics of an interference signal, and extracts the target signal based on the predicted one or more harmonics. In one approach, the communication system 102 reduces the predicted one or more harmonics from the electrical signal of the wireless signal represented in an analog format or in a digital format to obtain the target signal. Detailed description on implementations and operations of the communication system 102 are provided below with respect to FIGS. 3-10.

Figure 3:
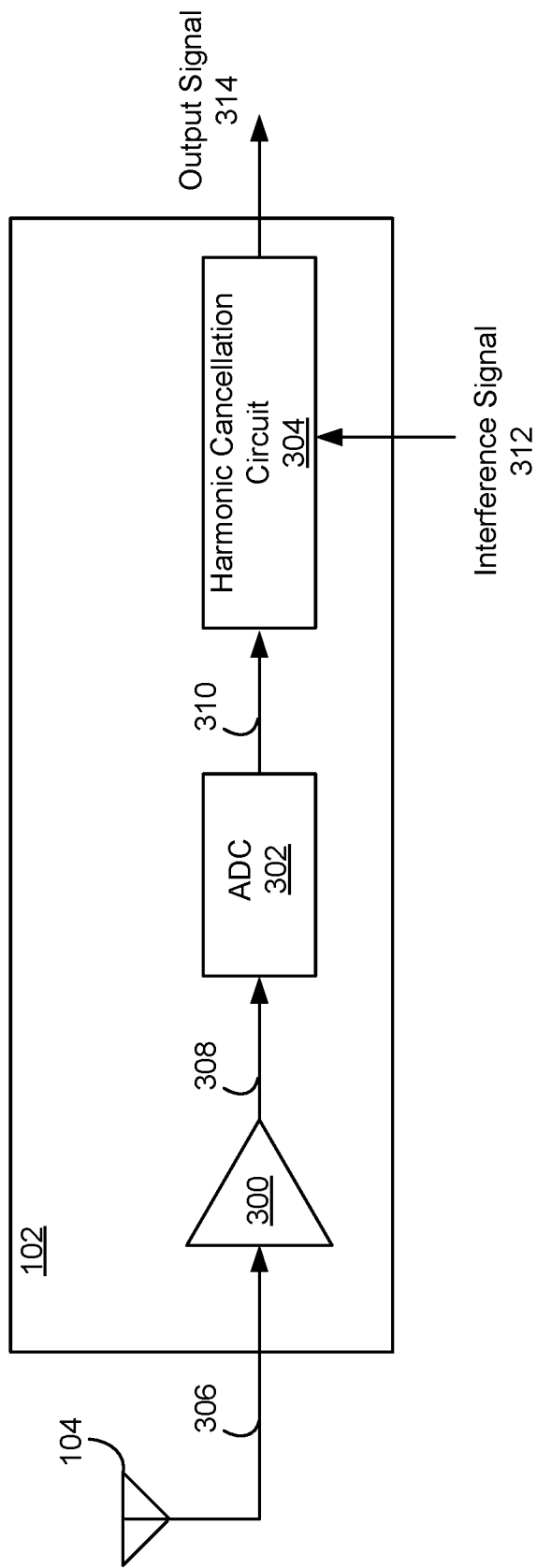
FIG. 3 is a schematic block diagram of the communication system with the adaptive harmonic cancellation illustrated in FIG. 2, according to some embodiments.

Referring to FIG. 3, illustrated is a schematic block diagram of the communication system 102 with the adaptive harmonic cancellation illustrated in FIG. 2, according to some embodiments. In one embodiment, the communication system 102 includes a low noise amplifier (LNA) 300, an analog to digital converter (ADC) 302, and a harmonic cancellation circuit 304. These components operate together to receive an electrical signal 306 from the antenna 104 and an interference signal 312 from a source of the interference, and generate an output signal 314. In one aspect, the communication system 102 generates the output signal 314 including a target signal with reduced harmonics of the interference signal 312. In some embodiments, the communication system 102 includes more, fewer, or different components than shown in FIG. 3. For example, the communication system 102 may include the antenna 104.

The LNA 300 is a front-end circuit of the communication system 102. In one configuration, the LNA 300 includes an input terminal and an output terminal. The input terminal of the LNA 300 is coupled to an output terminal of the antenna 104. In this configuration, the LNA 300 receives, through the input terminal, the electrical signal 306 that electrically represents the wireless signal received by the antenna 104 in voltage, current, or both. The electrical signal 306 is represented in an analog format. The LNA 300 amplifies the electrical signal 306 to generate an amplified electrical signal 308. The LNA 300 may amplify a portion of the electrical signal 306 at a frequency (e.g., radio frequency), and not amplify another portion of the electrical signal 306 at a different frequency. The portion of the electrical signal 306 at the frequency may include the target signal. The LNA 300 outputs the amplified electrical signal 308 at its output terminal.

The ADC 302 is a circuit that converts the amplified electrical signal 308 in an analog representation into a converted signal 310 in a digital representation. In one configuration, the ADC 302 includes an input terminal and an output terminal. The input terminal of the ADC 302 is coupled to the output terminal of the LNA 300. In this configuration, the ADC 302 receives, through the input terminal, the amplified electrical signal 308 including the target signal in the analog representation, and converts the amplified electrical signal 308 in the analog representation into the converted signal 310 in the digital representation. The ADC 302 outputs the converted signal 310 at its output terminal.

In one aspect, the converted signal 310 output by the ADC 302 includes radiated harmonics of the interference signal 312 that is radiated, for example, through an air space. The interference signal 312 may be generated by a motor or a generator within the aircraft of FIG. 1. The interference signal 312 may be at a low frequency (e.g., 400 Hz), and radiated harmonics of the interference signal 312 may present at or near a frequency of the target signal (e.g., 10-60 kHz). Such radiated harmonics at or near the frequency of the target signal may be received by the antenna 104 and propagate through the LNA 300 and the ADC 302 with the target signal. Hence, the converted signal 310 output by the ADC 302 may also include radiated harmonics of the interference signal 312. Such radiated harmonics of the interference signal may hinder the subsequent components from obtaining the target signal.

The harmonic cancellation circuit 304 is a circuit that reduces the one or more harmonics of the interference signal 312. In one configuration, the harmonic cancellation circuit 304 includes a first input terminal coupled to the output terminal of the ADC 302, a second input terminal coupled to a source (e.g., generator or motor of the aircraft) of the interference signal 312, and an output terminal coupled to a down-converter (not shown). In this configuration, the harmonic cancellation circuit 304 receives, through the first input terminal, the converted signal 310, and receives, through the second input terminal, the interference signal 312. The harmonic cancellation circuit 304 predicts one or more harmonics of the interference signal 312 in the converted signal 310, and removes the predicted harmonics of the interference signal 312 from the converted signal 310 to generate the output signal 314. The harmonic cancellation circuit 304 outputs the output signal 314 at its output terminal. The harmonic cancellation circuit 304 may receive the converted signal 310 and the interference signal 312 in the digital representation, and generate the output signal 314 in the digital representation. In one implementation, the harmonic cancellation circuit 304 is implemented as a field programmable gate array (FPGA), an application specific integrated circuit (ASIC), or a combination of them. Detailed operations and implementations of the harmonic cancellation circuit 304 are provided below with respect to FIGS. 4-10.

Figure 4:
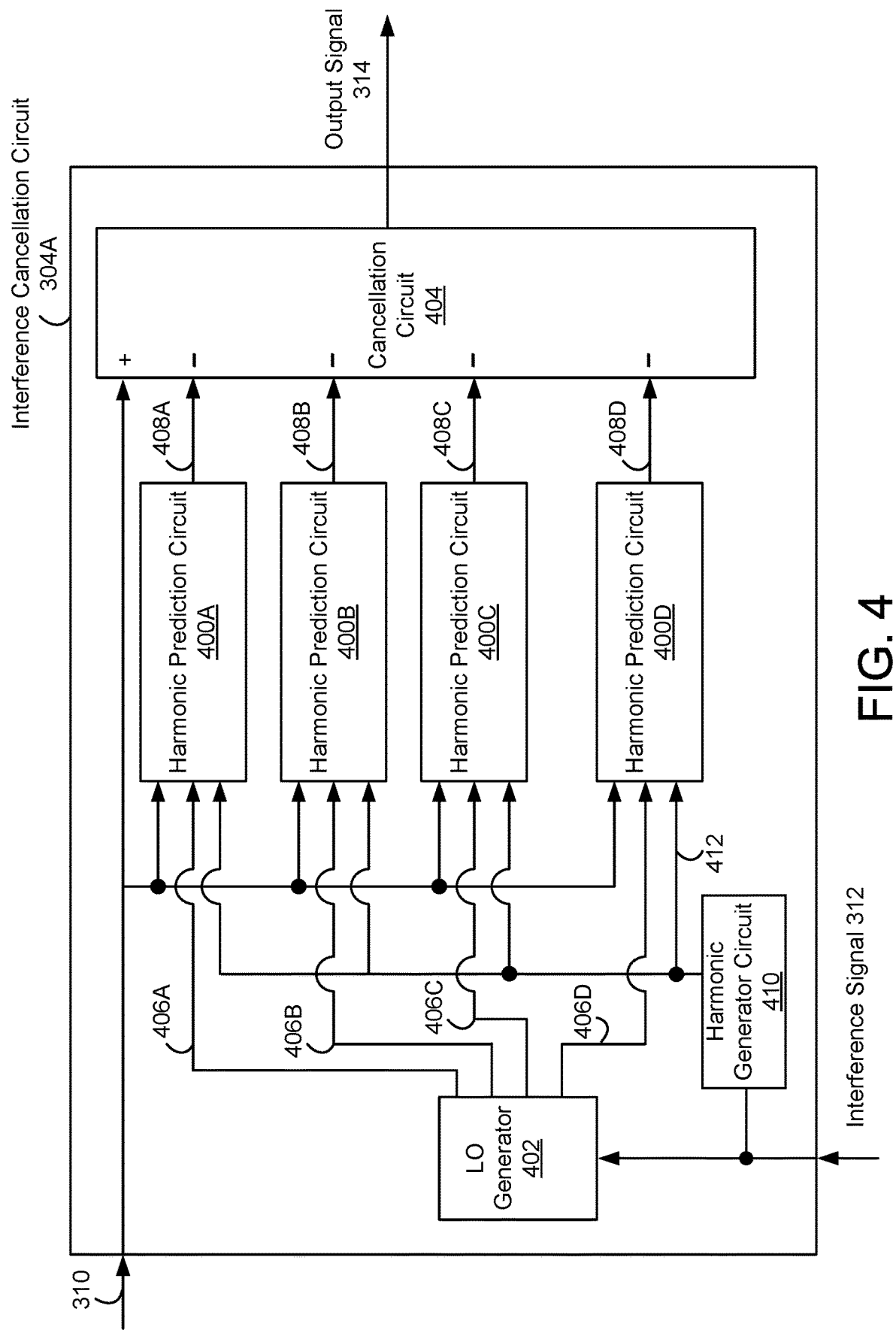
FIG. 4 is a schematic block diagram of a harmonic cancellation circuit illustrated in FIG. 3, according to some embodiments.

Referring to FIG. 4, illustrated is a schematic block diagram of the harmonic cancellation circuit 304 illustrated in FIG. 3, according to some embodiments. In some embodiments, the harmonic cancellation circuit 304A as shown in FIG. 4 includes harmonic prediction circuits 400A, 400B, 400C, 400D, a local oscillator (LO) generator 402, a cancellation circuit 404, and a harmonic generator circuit 410. These components may be implemented as digital circuits or logic of the FPGA, ASIC, or a combination of them. These components operate together to receive the converted signal 310 and the interference signal 312, and generate the output signal 314. In one aspect, the converted signal 310 is an input signal of the harmonic cancellation circuit 304A including the target signal from another communication system and radiated harmonics of the interference signal 312. The harmonic cancellation circuit 304A predicts one or more harmonics of the interference signal 312, and removes the predicted harmonics from the input signal 310 to generate the output signal 314 having the target signal with reduced harmonics of the interference signal 312. In some embodiments, the harmonic cancellation circuit 304A includes more, fewer, or different components than shown in FIG. 4. For example, the harmonic cancellation circuit 304A includes more or fewer number of harmonic prediction circuits 400 than shown in FIG. 4.

Figure 9:
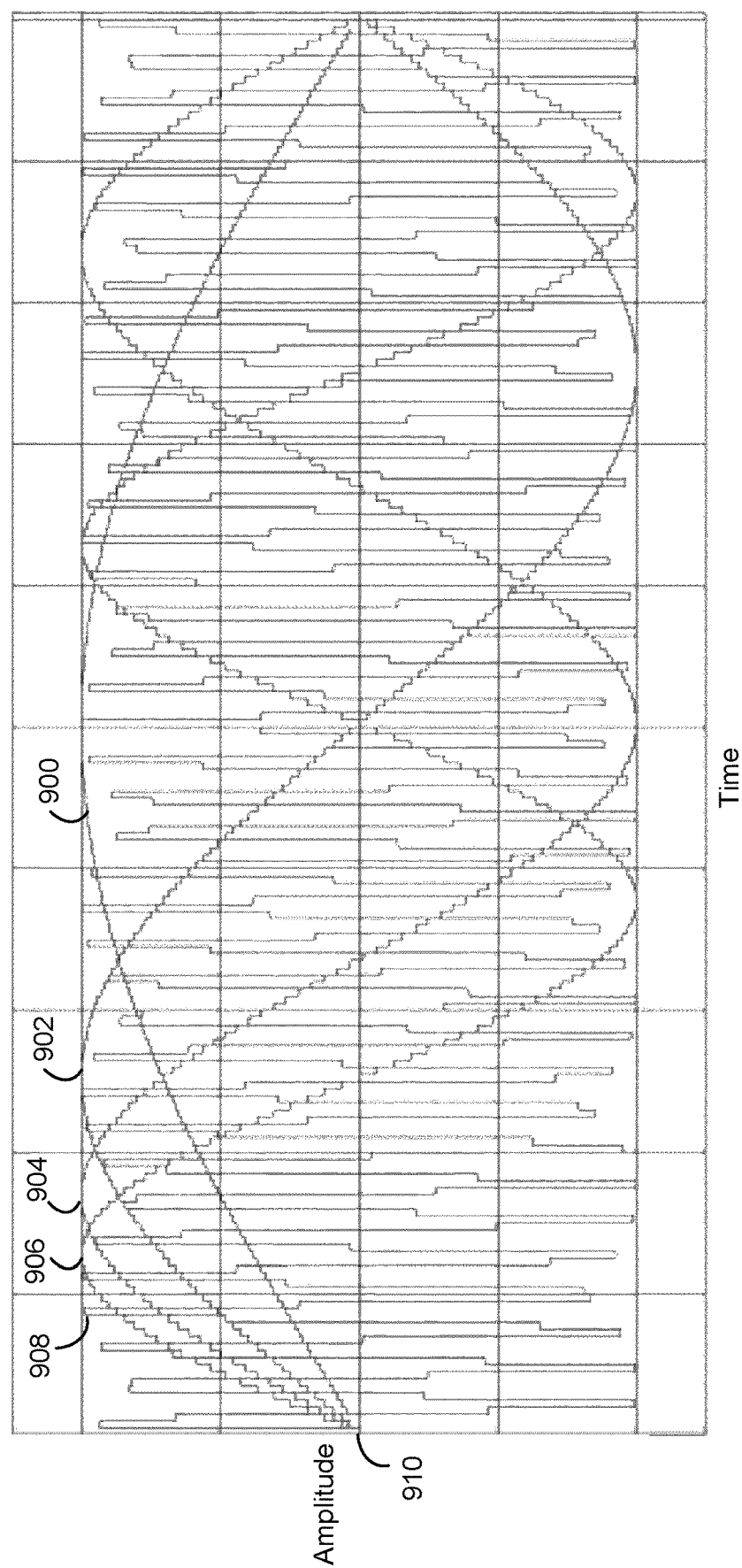
FIG. 9 shows waveforms of outputs of the local oscillator generator illustrated in FIG. 7, according to some embodiments.

The LO generator 402 is a component that generates one or more LO signals 406A, 406B, 406C, 406D. In some embodiments, the LO generator 402 includes an input terminal to receive the interference signal 312, and output terminals coupled to corresponding input terminals of the harmonic prediction circuit 400. In this configuration, the LO generator 402 receives, through the input terminal, the interference signal 312, and generates LO signals 406A, 406B, 406C, 406D at corresponding output terminals, respectively. Each LO signal 406 is associated with a corresponding harmonic of the interference signal 312. For example, the LO signal 406A corresponds to a first harmonic of the interference signal 312, the LO signal 406B corresponds to a second harmonic of the interference signal 312, the LO signal 406C corresponds to a third harmonic of the interference signal 312, and the LO signal 406D corresponds to a fourth harmonic of the interference signal 312. In one aspect, the LO signals 406A, 406B, 406C, 406D may be synchronized with each other. For example, the LO signals 406A, 406B, 406C, 406D have same zero crossing points. The LO generator 402 may generate the LO signals 406 each having a corresponding sinusoidal waveform in the digital representation as shown in FIG. 9.

Such synchronization allows the LO generator 402 to shift frequency simultaneously at zero crossings without introducing uncorrectable errors into the predicted harmonic, thus the LO generator 402 can closely follow the interference signal 312 in tandem and in real time as the interference signal 312 may change in frequency. Any errors to the predicted harmonic signals, which may be introduced by the LO generator 402, may be corrected by opposing errors when the complex conjugate of the LO generator 402 is applied to the predicted harmonic during the final conversion.

The harmonic generator circuit 410 is a circuit that generates a reference signal 412 based on the interference signal 312. In one configuration, the harmonic generator circuit 410 includes an input terminal to receive the interference signal 312 and an output terminal coupled to input terminals of the harmonic prediction circuits 400A, 400B, 400C, 400D. In this configuration, the harmonic generator circuit 410 generates the reference signal 412 including one or more reference harmonics of the interference signal 312. A reference harmonic of an interference signal 312 is a harmonic of the interference signal 312 internally generated within the harmonic cancellation circuit 304. The harmonic generator circuit 410 may output the reference signal 412 including a group of reference harmonics of the interference signal 312 at its output terminal.

The harmonic prediction circuit 400 is a circuit that generates a predicted harmonic 408 of the interference signal 312. Each harmonic prediction circuit 400 includes a first input terminal to receive the input signal 310, a second input terminal coupled to the output terminal of the harmonic generator circuit 410, a third input terminal coupled to a corresponding output terminal of the LO generator 402 to receive a corresponding LO signal 406, and an output terminal coupled to corresponding input terminals of the cancellation circuit 404. In this configuration, each harmonic prediction circuit 400 receives a corresponding LO signal 406, and generates a corresponding predicted harmonic 408 of the interference signal 312 according to the LO signal 406. For example, the harmonic prediction circuit 400A receives the LO signal 406A corresponding to a first harmonic of the interference signal 312, and generates a first predicted harmonic 408A of the interference signal 312 according to the LO signal 406A. Similarly, the harmonic prediction circuit 400B receives the LO signal 406B corresponding to a second harmonic of the interference signal 312, and generates a second predicted harmonic 408B of the interference signal 312 according to the LO signal 406B. In one aspect, different harmonic prediction circuits 400A, 400B, 400C, 400D generate different harmonics 408A, 408B, 408C, 408D of the interference signal 312, respectively, in parallel. Detailed operations and implementations of the harmonic prediction circuit 400 are provided below with respect to FIG. 6.

The cancellation circuit 404 is a circuit that receives the predicted harmonics 408 of the interference signal 312 from the harmonic prediction circuits 400A, 400B, 400C, 400D, and generates the output signal 314 having a target signal with reduced harmonics of the interference signal 312. In some embodiments, the cancellation circuit 404 includes an input terminal to receive the input signal 310, additional input terminals each coupled to an output terminal of a corresponding harmonic prediction circuit 400, and an output terminal coupled to an input terminal of a down-converter (not shown). In this configuration, the cancellation circuit 404 removes the predicted harmonics 408A, 408B, 408C, 408D from the input signal 310 to generate the output signal 314. The cancellation circuit 404 may be implemented as a subtractor that subtracts the predicted harmonics 408A, 408B, 408C, 408D from the input signal 310 to generate the output signal 314. Hence, the output signal 314 may have a target signal, for example, at RF with reduced harmonics of the interference signal 312.

Figure 5:
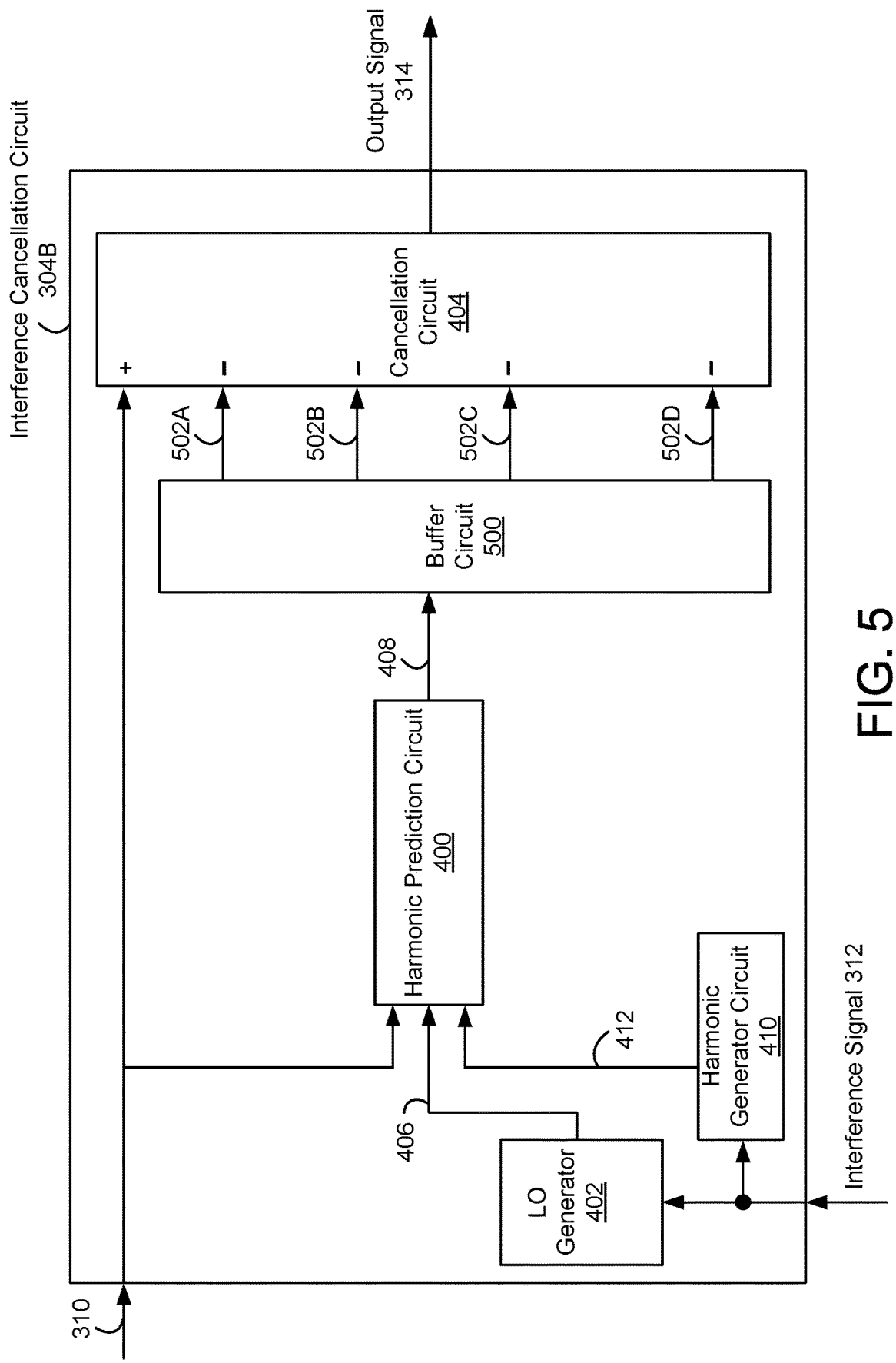
FIG. 5 is a schematic block diagram of a harmonic cancellation circuit illustrated in FIG. 3, according to some embodiments.

Referring to FIG. 5, illustrated is a schematic block diagram of the harmonic cancellation circuit 304 illustrated in FIG. 3, according to some embodiments. The configuration of the harmonic cancellation circuit 304B as shown in FIG. 5 is similar to the harmonic cancellation circuit 304A shown in FIG. 4, except that a single harmonic prediction circuit 400 is implemented and a buffer circuit 500 is implemented between the harmonic prediction circuit 400 and the cancellation circuit 404.

In one configuration, the harmonic prediction circuit 400 is reused at different time periods to generate the predicted harmonics 408 at different time periods. The LO generator 402 may generate an LO signal 406 at different frequencies at corresponding subsets of a time period. For example, the LO generator 402 generates the LO signal 406 corresponding to a first harmonic of the interference signal 312 at a first subset of the time period and generates the LO signal 406 corresponding to a second harmonic of the interference signal 312 at a second subset of the time period. The harmonic prediction circuit 400 receives the input signal 310, the LO signal 406, and the reference signal 412, and generates the predicted harmonic 408 of the interference signal 312 according to the LO signal 406. In one aspect, the harmonic prediction circuit 400 generates different predicted harmonics 408 at different subsets of the time period according to the LO signal 406. For example, the harmonic prediction circuit 400 generates a first predicted harmonic 408 according to the LO signal 406 corresponding to a first harmonic at a first subset of the time period, and generates a second predicted harmonic 408 according to the LO signal 406 corresponding to a second harmonic at a second subset of the time period.

The buffer circuit 500 is a circuit that operates as a serial to parallel converter that converts the predicted harmonic 408 in serial data into buffer outputs 502 in parallel data. In one configuration, the buffer circuit 500 includes an input terminal coupled to the output terminal of the harmonic prediction circuit 400, and output terminals coupled to corresponding input terminals of the cancellation circuit 404. In this configuration, the buffer circuit 500 receives the predicted harmonic 408 through the input terminal during a time period, where the predicted harmonic 408 changes at different subsets of the time period. Each subset of the time period is associated with a corresponding harmonic of the interference signal 312. The buffer circuit 500 may sample the predicted harmonic 408 at a subset of the time period for a corresponding harmonic of the interference signal 312, and output the sampled predicted harmonic 408 at an output terminal as a buffer output 502 associated with the corresponding harmonic. For example, the buffer circuit 500 samples the predicted harmonic 408 during a first subset of the time period, and samples the predicted harmonic 408 during a second subset of the time period. The buffer circuit 500 may output the predicted harmonic 408 sampled during the first subset of the time period as the buffer output 502A for a first harmonic of the interference signal 312, and output the predicted harmonic 408 sampled during the second subset of the time period as the buffer output 502B for a second harmonic of the interference signal 312. The buffer circuit 500 may output different buffer outputs 502A, 502B, 502C, 502D simultaneously or sequentially.

Figure 6:
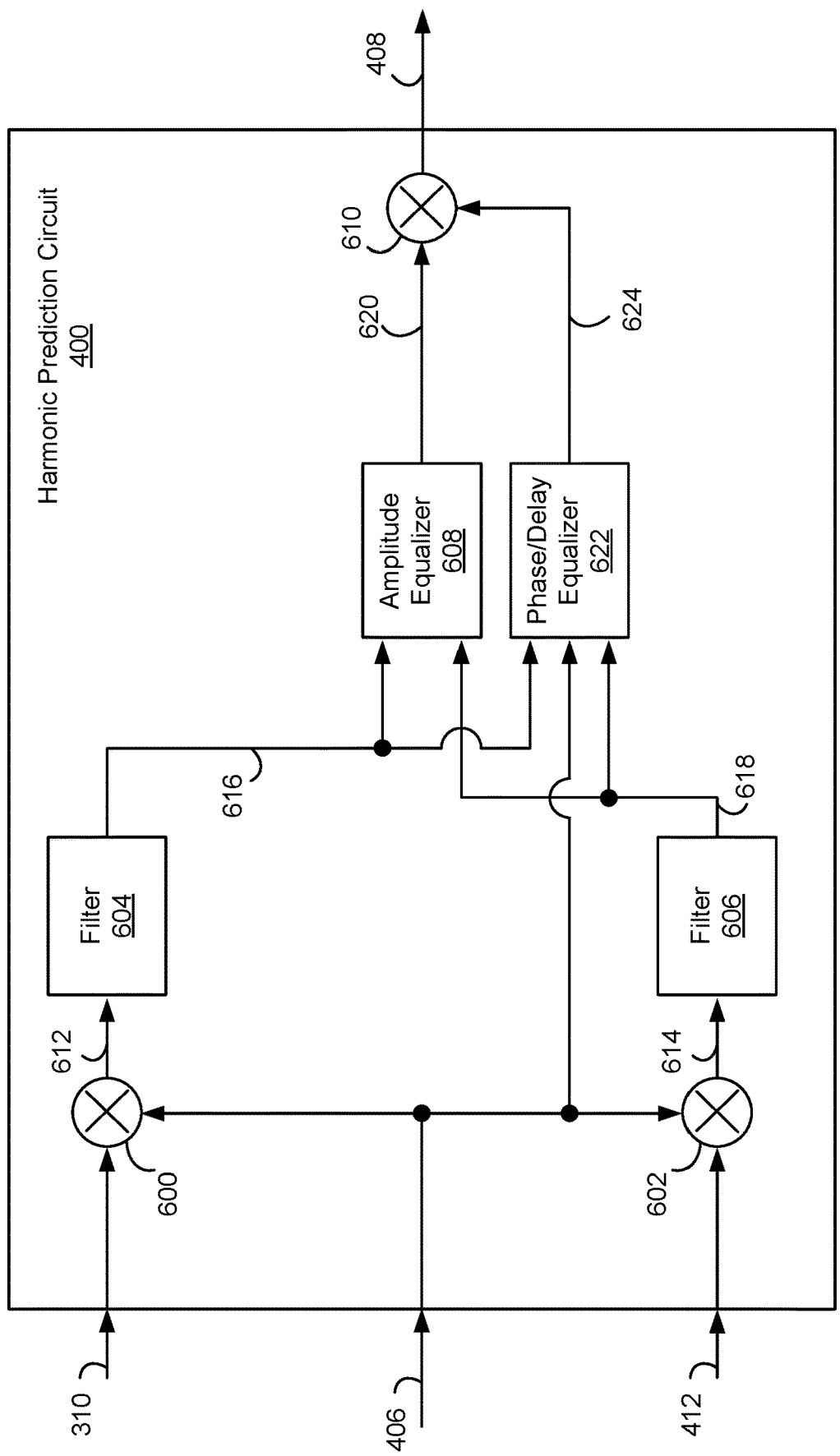
FIG. 6 is a schematic block diagram of a harmonic prediction circuit illustrated in FIG. 4 or FIG. 5, according to some embodiments.

Referring to FIG. 6, illustrated is a schematic block diagram of the harmonic prediction circuit 400 illustrated in FIG. 4 or FIG. 5, according to some embodiments. In some embodiments, the harmonic prediction circuit 400 includes down-converters 600, 602, filters 604, 606, an amplitude equalizer 608, a phase/delay equalizer 622, and an up-converter 610. These components operate together to generate a predicted harmonic 408 of the interference signal 312. In other embodiments, the harmonic prediction circuit 400 includes more, fewer, or different components than shown in FIG. 6.

The down-converter 600 and the filter 604 are circuits to down-convert the input signal 310 according to the LO signal 406 to obtain a baseband signal or an intermediate frequency signal at a lower frequency than the frequency of the input signal 310. In one configuration, the down-converter 600 includes a first input terminal to receive the input signal 310, a second input terminal to receive the LO signal 406, and an output terminal to output the down-converted input signal 612. The filter 604 includes an input terminal coupled to the output terminal of the down-converter 600, and an output terminal coupled to (i) an input terminal of the amplitude equalizer 608 and (ii) an input terminal of the phase/delay equalizer 622. In one aspect, the down-converter 600 down-converts the input signal 310 at RF into a down-converted input signal 612 at a lower frequency than the RF according to the LO signal 406. The down-converted input signal 612 may include harmonics due to the down-conversion by the down-converter 600. The filter 604 may filter out, from the down-converted input signal 612, harmonics occurring due to the down-conversion by the down-converter 600 to obtain the filtered down-converted input signal 616. The filter 604 provides the filtered down-converted input signal 616 to the amplitude equalizer 608 and the phase/delay equalizer 622.

The down-converter 602 and the filter 606 are circuits to down-convert the reference signal 412 at RF according to the LO signal 406 to obtain a baseband signal or an intermediate frequency signal at a lower frequency than the frequency of the reference signal 412. The reference signal 412 includes one or more reference harmonics of the interference signal 312. In one configuration, the down-converter 602 includes a first input terminal to receive the reference signal 412, a second input terminal to receive the LO signal 406, and an output terminal to output the down-converted reference signal 614. The filter 606 includes an input terminal coupled to the output terminal of the down-converter 602, and an output terminal coupled to (i) an input terminal of the amplitude equalizer 608 and (ii) an input terminal of the phase/delay equalizer 622. In one aspect, the down-converter 602 down-converts the reference signal 412 into a down-converted reference signal 614 at a lower frequency according to the LO signal 406. The down-converted reference signal 614 may include harmonics due to the down-conversion by the down-converter 602. The filter 606 may filter out, from the down-converted reference signal 614, harmonics occurring due to the down-conversion by the down-converter 602 to obtain the filtered down-converted reference signal 618. The filter 606 provides the filtered down-converted reference signal 618 to the amplitude equalizer 608 and the phase/delay equalizer 622.

The amplitude equalizer 608 is a circuit that modifies an amplitude of the filtered down-converted reference signal 618 to match the filtered down-converted input signal 616. In one configuration, the amplitude equalizer 608 includes a first input terminal coupled to the output terminal of the filter 604, a second input terminal coupled to the output terminal of the filter 606, and an output terminal coupled to an input terminal of the up-converter 610. In this configuration, the amplitude equalizer 608 receives the filtered down-converted input signal 616 through the first input terminal from the filter 604, and receives the filtered down-converted reference signal 618 through the second input terminal from the filter 606. The amplitude equalizer 608 modifies amplitude of the filtered down-converted reference signal 618 to match the filtered down-converted input signal 616, and outputs the modified signal 620 at its output terminal.

The phase/delay equalizer 622 is a circuit that modifies phase and/or delay of the LO signal 406 so that the phase and delay of the LO signal 406 from the harmonic prediction circuit 400 corresponds with the phase and delay of the down-converted input signal 616. In one configuration, the phase/delay equalizer 622 includes a first input terminal coupled to the output terminal of the filter 604, a second input terminal coupled to the output terminal of the filter 606, a third input terminal to receive the LO signal 406, and an output terminal coupled to an input terminal of the up-converter 610. In this configuration, the phase/delay equalizer 622 receives the filtered down-converted input signal 616 through the first input terminal from the filter 604, receives the filtered down-converted reference signal 618 through the second input terminal from the filter 606, and receives the LO signal 406 through the third input terminal. In one aspect, the phase/delay equalizer 622 measures a phase difference, a delay difference or a combination of them between the down-converted input signal 616 and the down-converted reference signal 618. The phase/delay equalizer 622 then obtains a modified LO signal 624 by shifting a phase, a delay, or both of the LO signal 406 according to the measured phase difference, delay difference or both, and outputs the modified LO signal 624 at its output terminal. In some embodiments, the phase/delay equalizer 622 converts the modified LO signal 624 into a complex conjugate form, and outputs the converted LO signal at the output terminal.

The up-converter 610 is a circuit that up-converts the modified signal 620 to obtain the predicted harmonics of the interference signal 312. In one configuration, the up-converter 610 includes a first input terminal coupled to the output terminal of the amplitude equalizer 608, a second input terminal coupled to the output terminal of the phase/delay equalizer 622, and an output terminal to output the predicted harmonic 408 of the interference signal 312. In this configuration, the up-converter 610 up-converts the modified signal 620 according to the modified LO signal 624 (or a complex conjugate of the modified LO signal 624) to obtain the predicted harmonic 408 of the interference signal 312. In one aspect, the predicted harmonic 408 of the interference signal 312 is a reference harmonic of the interference signal 312 that is modified to have matching amplitude and phase (or delay) of the radiated harmonic present in the input signal 310. Hence, the predicted harmonic 408 may be subtracted from the input signal 310 to reduce radiated harmonic present in the input signal 310 without employing a feedback loop or a phase locked loop.

In one aspect, the same down-conversion and filtering performed on the input signal are performed on the reference signal 412. For example, the down-converters 600, 602 are identical with each other, and the filters 604, 606 are identical with each other. Hence, from multiple reference harmonics of the interference signal 312 in the reference signal 412, a reference harmonic at a same frequency with a radiated harmonic in the input signal 310 can be selected according to the LO signal 406, and the selected reference harmonic can be modified to match the radiated harmonic at the same frequency.

Figure 7:
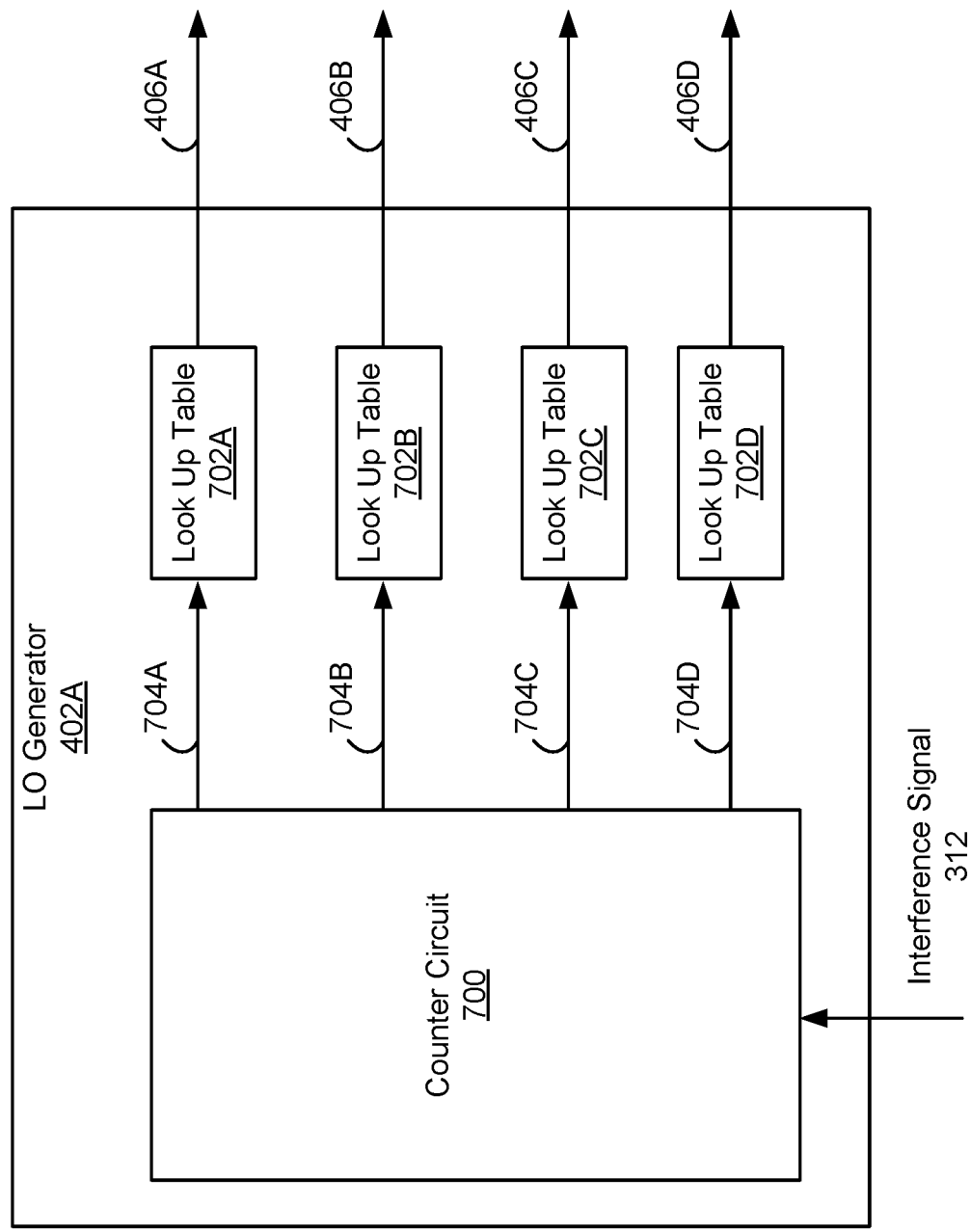
FIG. 7 is a schematic block diagram of a local oscillator generator illustrated in FIG. 4, according to some embodiments.

Referring to FIG. 7, illustrated is a schematic block diagram of the LO generator 402 illustrated in FIG. 4, according to some embodiments. In some embodiments, the LO generator 402A as shown in FIG. 7 includes a counter circuit 700 and look up tables 702A, 702B, 702C, 702D. These components operate together to generate the LO signals 406A, 406B, 406C, 406D, according to the interference signal 312. In other embodiments, the LO generator 402A includes more, fewer, or different components than shown in FIG. 7.

The counter circuit 700 is a circuit that counts a number of pulses during a period of the interference signal 312. In one configuration, the counter circuit 700 includes an input terminal to receive the interference signal 312, and output terminals coupled to corresponding input terminals of look up tables 702A, 702B, 702C, 702D. The counter circuit 700 may include or is coupled to a reference clock. The counter circuit 700 may count a number of pulses of the reference clock during the period of the interference signal 312. The counter circuit 700 may multiply the counted number by corresponding numbers (e.g., integers) to obtain different reference numbers 704A, 704B, 704C, 704D. In one aspect, a reference number indicates a frequency of a corresponding harmonic of the interference signal 312. The look up table 702 may generate a LO signal 406 at a frequency according to the reference number. The counter circuit 700 outputs the reference numbers 704A, 704B, 704C, 704D at corresponding output terminals.

The look up table 702 is a circuit that generates a sinusoidal waveform in a digital representation according to a reference number 704. In one configuration, the look up table 702 includes an input terminal coupled to an output terminal of the counter circuit 700, and an output terminal to output the LO signal 406. In this configuration, the look up table 702 generates the LO signal 406 having a sinusoidal waveform in a digital representation as shown in FIG. 9. Different look up tables 702A, 702B, 702C, 702D may receive different reference numbers 704A, 704B, 704C, 704D, and generate the LO signals 406A, 406B, 406C, 406D at different frequencies. For example, the LO signal 406A may have a frequency approximately fifty times the frequency of the interference signal 312; the LO signal 406B may have a frequency approximately fifty one times the frequency of the interference signal 312; the LO signal 406C may have a frequency approximately fifty two times the frequency of the interference signal 312; and the LO signal 406D may have a frequency approximately fifty three times the frequency of interference signal 312. Hence, different LO signals 406 may be associated with a corresponding harmonic of the interference signal 312. For example, the LO signal 406A corresponds to a first harmonic of the interference signal 312; the LO signal 406B corresponds to a second harmonic of the interference signal 312; the LO signal 406C corresponds to a third harmonic of the interference signal 312; and the LO signal 406D corresponds to a fourth harmonic of the interference signal 312. The look up tables 702A, 702B, 702C, 702D may output the LO signals 406A, 406B, 406C, 406D simultaneously. The LO signals 406A, 406B, 406C, 406D may be synchronized with each other, and have same zero crossing points.

Figure 8:
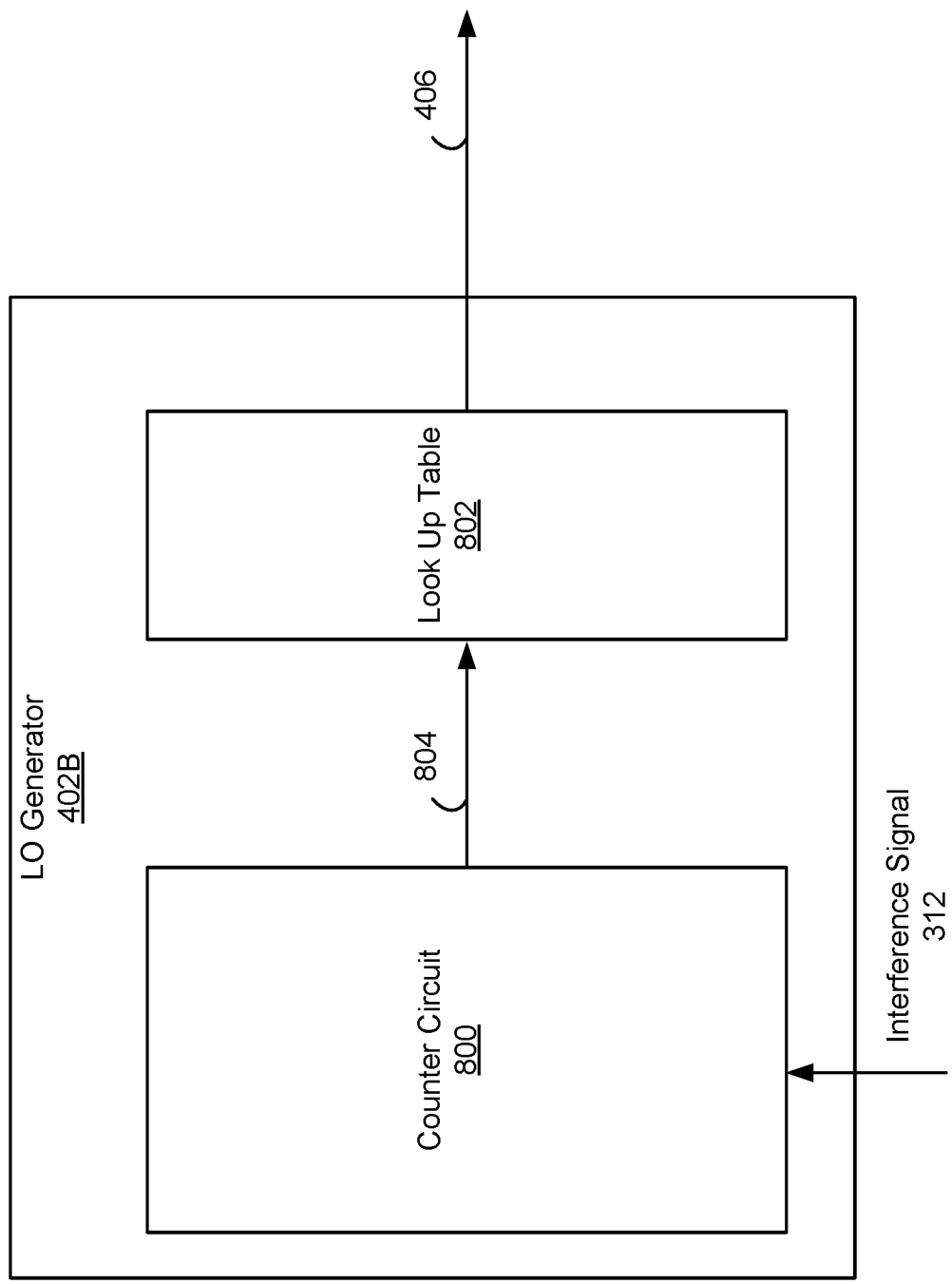
FIG. 8 is a schematic block diagram of a local oscillator generator illustrated in FIG. 5, according to some embodiments.

Referring to FIG. 8, illustrated is a schematic block diagram of the LO generator 402B illustrated in FIG. 5, according to some embodiments. The LO generator 402B shown in FIG. 8 is similar to the LO generator 402A shown in FIG. 7, except a single look up table 802 is included in the LO generator 402B. In one aspect, the LO generator 402B outputs the LO signal 406 that changes during a predetermined time period. For example, the LO signal 406 during a first subset of the predetermined time period may be at a first frequency for a first harmonic of the interference signal, and the LO signal 406 during a second subset of the predetermined time period may be at a second frequency for a second harmonic of the interference signal.

The counter circuit 800 is a circuit that receives the interference signal 312 and generates the reference number 804 that changes during the predetermined time period. In one configuration, the counter circuit 800 includes an input terminal to receive the interference signal 312, and a single output terminal coupled to an input terminal of the look up table 802. The counter circuit 800 may include or is coupled to a reference clock. The counter circuit 800 may count a number of pulses of the reference clock during the period of the interference signal 312. The counter circuit 800 may multiply the counted number by different numbers during corresponding subset of the predetermined time period. For example, the counter circuit 800 multiplies the counted number by one during a first subset of the predetermined time period and multiples the counted number by two during a second subset of the predetermined time period. The counter circuit 800 outputs the reference number 804 that changes during the predetermined time period at its output terminal.

The look up table 802 is a circuit that receives the reference number 804 from the counter circuit 800 and generates a sinusoidal waveform in a digital representation according to a reference number 804. In one configuration, the look up table 802 includes an input terminal coupled to an output terminal of the counter circuit 800, and an output terminal to output the LO signal 406. In this configuration, the look up table 802 generates the LO signal 406 having a sinusoidal waveform in a digital representation as shown in FIG. 9. In one aspect, because the reference number 804 from the counter circuit 800 changes over the different subsets of the predetermined time period, the look up table 802 generates the LO signal 406 having different frequencies at different subsets. For example, a frequency of the LO signal 406 during a second subset of the predetermined time period is two times the frequency of the LO signal 406 during a first subset of the predetermined time period; a frequency of the LO signal 406 during a third subset of the predetermined time period is three times the frequency of the LO signal 406 during the first subset of the predetermined time period; and a frequency of the LO signal 406 during a fourth subset of the predetermined time period is four times the frequency of the LO signal 406 during the first subset of the predetermined time period. In one aspect, the look up table 802 changes the frequency of the LO signal 406 at a zero-crossing point, such that spurious artifacts can be obviated.

Referring to FIG. 9, illustrated are waveforms of outputs of the LO generator 402A illustrated in FIG. 7 or the LO generator 402B illustrated in FIG. 8, according to some embodiments. The LO generator 402 may generate the LO signals having waveform 900, 902, 904, 906, 908 having different frequencies as shown in FIG. 9. The LO generator 402 may output different LO signals having corresponding waveforms 900, 902, 904, 906, 908 in parallel. Alternatively, the LO generator 402 outputs a LO signal having different waveforms 900, 902, 904, 906, 908 at different time periods. When the frequency of the LO signal changes, the LO generator 402 may change the frequency at a zero-crossing point, such that spurious artifacts can be obviated.

Figure 10:
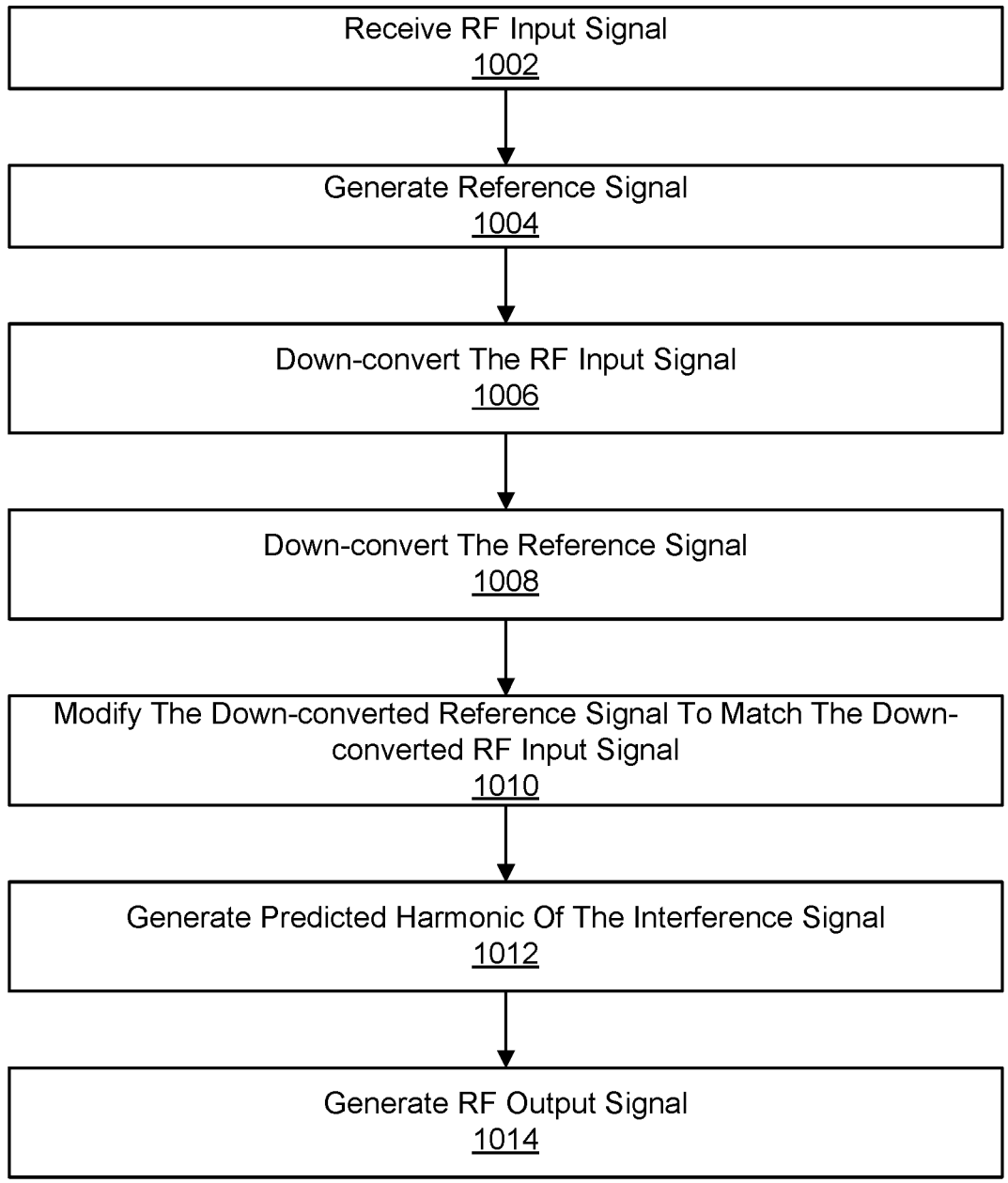
FIG. 10 is a flow chart illustrating a process of adaptively reducing a harmonic of interference, according to some embodiments.

Referring to FIG. 10, illustrated is a flow chart showing a process 1000 of adaptively reducing a harmonic of interference, according to some embodiments. The process 1000 may be performed by a communication system including the harmonic cancellation circuit 304 of FIG. 3. In other embodiments, the process 1000 may be performed by other entities. In other embodiments, the process 1000 includes more, fewer, or different steps than shown in FIG. 10.

The harmonic cancellation circuit 304 receives 1002 a RF input signal. In one aspect, the RF input signal includes a target signal generated by a transmitter of a different communication system at the RF. The transmitter of the different communication system may up-convert a baseband signal including content targeted for the communication system. Examples of content include audio, image, video, data, or any combination of them. The RF input signal may also include radiated harmonics of an interference signal. The radiated harmonics of the interference signal may be at a frequency of the target signal or near the frequency of the target signal. The interference signal may be generated within the communication system or from outside the communication system. The harmonics of the interference signal may be radiated through air space, and received through an antenna, through which the target signal of the RF input signal is received. The RF input signal may be represented in a digital format at RF.

The harmonic cancellation circuit 304 generates 1004 a reference signal. The reference signal includes reference harmonics of the interference signal. Reference harmonics of the interference signal may be harmonics of the interference signal internally generated by the harmonic cancellation circuit 304. The harmonic cancellation circuit 304 may receive the interference signal, for example, directly or indirectly from the source of the harmonic cancellation circuit 304, and generate the reference harmonics of the interference signal.

The harmonic cancellation circuit 304 down-converts 1006 the RF input signal. The harmonic cancellation circuit 304 down-converts 1008 the reference signal. The harmonic cancellation circuit 304 may generate a LO signal according to the interference signal, such that the LO signal corresponds to one or more harmonics of the interference signal. The harmonic cancellation circuit 304 may down-convert the RF input signal and the reference signal according to the same LO signal. The harmonic cancellation circuit 304 may filter the down-converted input signal and the down-converted reference signal to remove harmonics due to the down-conversions.

The harmonic cancellation circuit 304 modifies 1010 the down-converted reference signal to match the down-converted RF input signal. In one approach, the harmonic cancellation circuit 304 modifies delay, phase, amplitude, or a combination of them of the down-converted reference signal to match the down-converted RF input signal.

The harmonic cancellation circuit 304 generates 1012 a predicted harmonic of the interference signal based on the modified down-converted reference signal. In one approach, the harmonic cancellation circuit 304 up-converts the modified down-converted reference signal based on the LO signal to obtain the predicted harmonic of the interference signal. The harmonic cancellation circuit 304 may obtain a complex-conjugate of the LO signal employed for the down-conversion in steps 1004, 1006, and up-convert the modified down-converted reference signal according to the complex-conjugate of the LO signal.

The harmonic cancellation circuit 304 generates 1014 a RF output signal according to the predicted harmonic of the interference signal. In one approach, the harmonic cancellation circuit 304 removes the predicted harmonic of the interference signal from the RF input signal to obtain the RF output signal. The harmonic cancellation circuit 304 may generate multiple predicted harmonics of the interference signal and removes the predicted harmonics of the interference signal from the RF input signal. Hence, the RF output signal includes the target signal with reduced harmonics of the interference signal.

The construction and arrangement of the systems and methods as shown in the various exemplary embodiments are illustrative only. For example, although specific configurations of the communication system 102 are discussed, other configurations can be utilized. Although only a number of embodiments have been described in detail in this disclosure, many modifications are possible (e.g., variations in sizes, dimensions, structures, and proportions of the various elements, values of parameters, use of materials, orientations, etc.). For example, the correspondence of components to each other can be varied, the selected paths can be varied for different operational modes, and the nature or number of discrete elements or positions may be altered or varied. Accordingly, all such modifications are included within the scope of the inventive concepts disclosed herein. The order or sequence of any operational flow or method operations may be varied or re-sequenced according to alternative embodiments. Other substitutions, modifications, changes, and omissions may be made in the design, operating conditions and arrangement of the exemplary embodiments without departing from the scope of the inventive concepts disclosed herein.

What is claimed is:

1. An adaptive harmonic cancellation circuit comprising:
   a harmonic generator circuit configured to receive an interference signal from a source of the interference signal, and generate a reference harmonic of the interference signal;
   a harmonic prediction circuit coupled to the harmonic generator circuit, the harmonic prediction circuit configured to:
      receive an input signal at a frequency, the input signal including a target signal and a radiated harmonic of the interference signal, the input signal based on a radio frequency signal received by an antenna at the frequency, and
      generate a predicted harmonic of the interference signal by modifying the reference harmonic of the interference signal according to the radiated harmonic of the interference signal in the input signal; and
   a cancellation circuit coupled to the harmonic prediction circuit, the cancellation circuit configured to obtain the target signal at the frequency of the radio frequency signal received by the antenna by cancelling the predicted harmonic from the input signal.

2. The adaptive harmonic cancellation circuit of claim 1, wherein the harmonic prediction circuit is configured to modify a phase, a delay, or an amplitude of the reference harmonic of the interference signal to match the radiated harmonic of the interference signal in the input signal.

3. The adaptive harmonic cancellation circuit of claim 1, further comprising:
   a local oscillator generator coupled to the harmonic prediction circuit, the local oscillator generator configured to generate a local oscillation signal,
   wherein the harmonic prediction circuit is configured to modify the reference harmonic of the interference signal to match the radiated harmonic of the interference signal in the input signal according to the local oscillation signal.

4. The adaptive harmonic cancellation circuit of claim 3, wherein the harmonic prediction circuit includes:
   a first down-converter configured to down-convert the input signal according to the local oscillation signal,
   a second down-converter configured to down-convert the reference harmonic of the interference signal according to the local oscillation signal,
   an equalizer coupled to the first down-converter and the second down-converter, the equalizer configured to modify a phase, a delay, or an amplitude of the down-converted reference harmonic to match the down-converted input signal, and
   an up-converter coupled between the equalizer and the cancellation circuit, the up-converter configured to up-convert the modified down-converted reference harmonic according to a complex conjugate of the local oscillation signal to obtain the predicted harmonic.

5. The adaptive harmonic cancellation circuit of claim 1, wherein the harmonic prediction circuit is a first harmonic prediction circuit, wherein the radiated harmonic is a first radiated harmonic of the interference signal in the input signal, wherein the input signal further includes a second radiated harmonic of the interference signal in the input signal, wherein the reference harmonic is a first reference harmonic of the interference signal, and wherein the predicted harmonic is a first predicted harmonic of the interference signal, and wherein the harmonic generator circuit is configured to generate a second reference harmonic of the interference signal, the adaptive harmonic cancellation circuit further comprising:
   a second harmonic prediction circuit coupled between the cancellation circuit in parallel with the first harmonic prediction circuit, the second harmonic prediction circuit configured to:
      generate a second predicted harmonic of the interference signal by modifying the second reference harmonic of the interference signal to match the second radiated harmonic of the interference signal in the input signal, and
   wherein the cancellation circuit is configured to:
      obtain the target signal by cancelling the first predicted harmonic and the second predicted harmonic from the input signal.

6. The adaptive harmonic cancellation circuit of claim 1, wherein the radiated harmonic is a first radiated harmonic of the interference signal in the input signal, wherein the input signal further includes a second radiated harmonic of the interference signal in the input signal, wherein the reference harmonic is a first reference harmonic of the interference signal, and wherein the predicted harmonic is a first predicted harmonic of the interference signal, wherein the harmonic generator circuit is configured to generate a second reference harmonic of the interference signal, wherein the harmonic prediction circuit is configured to:

generate the first predicted harmonic of the interference signal by modifying the first reference harmonic of the interference signal to match the first radiated harmonic of the interference signal in the input signal during a first time period, and generate a second predicted harmonic of the interference signal by modifying the second reference harmonic of the interference signal to match the second radiated harmonic of the interference signal in the input signal during a second time period, and wherein the cancellation circuit is configured to:

obtain the target signal by cancelling the first predicted harmonic and the second predicted harmonic from the input signal.

7. The adaptive harmonic cancellation circuit of claim 1, wherein the frequency is a radio frequency.

8. The adaptive harmonic cancellation circuit of claim 1, further comprising;

an analog to digital converter coupled to the cancellation circuit, the analog to digital converter configured to:

convert the radio frequency signal in an analog representation into the input signal in a digital representation.

9. The adaptive harmonic cancellation circuit of claim 8, wherein the cancellation circuit obtains the target signal in the digital representation.

10. A method of adaptively cancelling a harmonic of interference, the method comprising:

receiving an interference signal from a source of the interference signal;

generating a reference harmonic of the interference signal;

receiving an input signal at a frequency, the input signal including a target signal and a radiated harmonic of the interference signal, the input signal based on a radio frequency signal received by an antenna at the frequency;

generating a predicted harmonic of the interference signal by modifying the reference harmonic of the interference signal according to the radiated harmonic of the interference signal in the input signal; and obtaining the target signal at the frequency of the radio frequency signal received by the antenna by cancelling the predicted harmonic from the input signal.

11. The method of claim 10, wherein modifying the interference signal includes:

modifying a phase, a delay, or an amplitude of the reference harmonic of the interference signal to match the radiated harmonic of the interference signal in the input signal.

12. The method of claim 10, further comprising:

generating a local oscillation signal, wherein the reference harmonic of the interference signal is modified to match the radiated harmonic of the interference signal in the input signal according to the local oscillation signal.

13. The method of claim 12, wherein generating the predicted harmonic of the interference signal includes:

down-converting the input signal according to the local oscillation signal;

down-converting the reference harmonic of the interference signal according to the local oscillation signal;

modifying a phase, a delay, or an amplitude of the down-converted reference harmonic to match the down-converted input signal; and up-converting the modified down-converted reference harmonic according to a complex conjugate of the local oscillation signal to obtain the predicted harmonic.

14. The method of claim 10, wherein the radiated harmonic is a first radiated harmonic of the interference signal in the input signal, wherein the input signal further includes a second radiated harmonic of the interference signal in the input signal, wherein the reference harmonic is a first reference harmonic of the interference signal, and wherein the predicted harmonic is a first predicted harmonic of the interference signal, wherein the first predicted harmonic is generated during a first time period, the method further comprising:

generating a second reference harmonic of the interference signal; and generating a second predicted harmonic of the interference signal by modifying the second reference harmonic of the interference signal to match the second radiated harmonic of the interference signal in the input signal during a second time period, wherein the target signal is obtained by cancelling the first predicted harmonic and the second predicted harmonic from the input signal.

15. The method of claim 10, wherein the radiated harmonic is a first radiated harmonic of the interference signal in the input signal, wherein the input signal further includes a second radiated harmonic of the interference signal in the input signal, wherein the reference harmonic is a first reference harmonic of the interference signal, and wherein the predicted harmonic is a first predicted harmonic of the interference signal, the method further comprising:

generating a second reference harmonic of the interference signal; and generating a second predicted harmonic of the interference signal by modifying the second reference harmonic of the interference signal to match the second radiated harmonic of the interference signal in the input signal, wherein the first predicted harmonic of the interference signal is generated by a first harmonic prediction circuit, wherein the second predicted harmonic of the interference signal is generated by a second harmonic prediction circuit, wherein the target signal is obtained by cancelling the first predicted harmonic and the second predicted harmonic from the input signal.

16. The method of claim 10, wherein the frequency is a radio frequency.

17. The method of claim 10, further comprising:

converting the radio frequency signal in an analog representation into the input signal in a digital representation.

18. The method of claim 17, wherein the target signal is obtained in the digital representation.

19. A system of adaptively cancelling a harmonic of interference, the system comprising:

a harmonic prediction circuit configured to:

down-convert an input signal at a first frequency, the input signal including a target signal and a radiated harmonic of an interference signal, down-convert a reference harmonic of the interference signal to a second frequency lower than the first frequency, modify the down-converted reference harmonic according to the down-converted input signal, and up-convert the modified down-converted reference harmonic to the first frequency to generate a predicted harmonic of the interference signal; and a cancellation circuit configured to obtain the target signal by cancelling the predicted harmonic from the input signal.

20. The system of claim 19, further comprising:

an analog to digital converter configured to convert a radio frequency signal at the first frequency in an analog representation into the input signal in a digital representation, wherein the harmonic prediction circuit and the cancellation circuit are digital circuits.

\* \* \* \* \*